US010142747B2

(12) United States Patent
Helgeson et al.

(10) Patent No.: US 10,142,747 B2
(45) Date of Patent: *Nov. 27, 2018

(54) THREE DIMENSIONAL SUBSTRATE FOR HEARING ASSISTANCE DEVICES

(71) Applicant: Starkey Laboratories, Inc., Eden Prairie, MN (US)

(72) Inventors: Michael Helgeson, New Richmond, WI (US); Jeffrey Paul Solum, Greenwood, MN (US); David Tourtelotte, Eden Prairie, MN (US); Beau Jay Polinske, Minneapolis, MN (US)

(73) Assignee: Starkey Laboratories, Inc., Eden Prairie, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/413,176

(22) Filed: Jan. 23, 2017

(65) Prior Publication Data

US 2017/0134870 A1 May 11, 2017

Related U.S. Application Data

(63) Continuation-in-part of application No. 15/043,800, filed on Feb. 15, 2016, now abandoned, which is a
(Continued)

(51) Int. Cl.
*H04R 25/00* (2006.01)
*H05K 1/18* (2006.01)

(52) U.S. Cl.
CPC ........... *H04R 25/65* (2013.01); *H04R 25/602* (2013.01); *H04R 25/608* (2013.01); *H05K 1/189* (2013.01);
(Continued)

(58) Field of Classification Search
CPC ...... H04R 25/60; H04R 25/65; H04R 25/602; H04R 2225/31; H04R 2225/33;
(Continued)

(56) References Cited

U.S. PATENT DOCUMENTS 3,601,550 A 8/1971 Spracklen
5,390,254 A 2/1995 Adelman
(Continued)

FOREIGN PATENT DOCUMENTS

DE 10236469 B3 2/2004
EP 0382675 A1 8/1990
(Continued)

OTHER PUBLICATIONS

"U.S. Appl. No. 11/357,751, Final Office Action dated Feb. 17, 2009", 11 pgs.
(Continued)

*Primary Examiner* — Suhan Ni
(74) *Attorney, Agent, or Firm* — Schwegman Lundberg & Woessner, P.A.

(57) ABSTRACT

A heating assistance device for a user comprising a housing, a three dimensional electronic substrate disposed in the housing, the substrate adapted to conform to a battery of the hearing assistance device and hearing assistance electronics mounted to the substrate. Various embodiments include a flexible antenna configured to conform around a portion of the substrate, and spring loaded electrical contacts on the substrate, the contacts configured to mechanically engage and electrically connect to the flexible antenna.

20 Claims, 10 Drawing Sheets

Related U.S. Application Data continuation of application No. 14/287,334, filed on May 27, 2014, now Pat. No. 9,264,826, which is a continuation of application No. 12/340,591, filed on Dec. 19, 2008, now Pat. No. 8,737,658.

(52) U.S. Cl.
CPC .... *H04R 2225/51* (2013.01); *H05K 2201/056* (2013.01); *H05K 2201/10037* (2013.01)

(58) Field of Classification Search
CPC ........ H04R 2225/023; H04R 2225/025; H04R 1/105; H04R 2225/021; H04R 2225/63; H04R 2460/13; H04R 1/106
USPC ................. 381/322–324, 328, 330, 380–381
See application file for complete search history.

(56) References Cited

U.S. PATENT DOCUMENTS

| | | |
|---|---|---|
| 5,734,976 A | 3/1998 | Bartschi et al. |
| 5,808,587 A | 9/1998 | Shima |
| 5,842,115 A | 11/1998 | Dent |
| 6,041,128 A | 3/2000 | Narisawa et al. |
| 6,041,129 A | 3/2000 | Adelman |
| 6,061,037 A | 5/2000 | Brouwers et al. |
| 6,205,227 B1 | 3/2001 | Mahoney et al. |
| 6,249,256 B1 | 6/2001 | Luxon et al. |
| 6,281,854 B1 | 8/2001 | Ohoka et al. |
| 6,307,945 B1 | 10/2001 | Hall |
| 6,380,896 B1 | 4/2002 | Berger et al. |
| 6,449,461 B1 | 9/2002 | Otten |
| 6,456,720 B1 | 9/2002 | Brimhall et al. |
| 6,459,415 B1 | 10/2002 | Pachal et al. |
| 6,473,512 B1 | 10/2002 | Juneau et al. |
| 6,501,437 B1 | 12/2002 | Gyorko et al. |
| 6,546,109 B1 | 4/2003 | Gnecco et al. |
| 6,597,320 B2 | 7/2003 | Maeda et al. |
| 6,603,440 B2 | 8/2003 | Howard |
| 6,674,869 B2 | 1/2004 | Paczkowski |
| 6,724,901 B1 | 4/2004 | Preuthun |
| 6,865,279 B2 | 3/2005 | Leedom |
| 7,142,682 B2 | 11/2006 | Mullenborn et al. |
| 7,265,721 B2 | 9/2007 | Shigehiro et al. |
| 7,289,069 B2 | 10/2007 | Ranta |
| 7,315,290 B2 | 1/2008 | Harada et al. |
| 7,426,279 B2 | 9/2008 | Cochran et al. |
| 7,443,992 B2 | 10/2008 | Fideler |
| 7,450,078 B2 | 11/2008 | Knudsen et al. |
| 7,454,027 B2 | 11/2008 | Sorensen |
| 7,593,538 B2 | 9/2009 | Polinske |
| 7,659,469 B2 | 2/2010 | Belli |
| 7,742,614 B2 | 6/2010 | Christensen et al. |
| 7,777,681 B2 | 8/2010 | Platz |
| 7,859,469 B1 | 12/2010 | Rosener et al. |
| 7,881,486 B1 | 2/2011 | Killion et al. |
| 8,073,173 B2 | 12/2011 | Onodera |
| 8,150,075 B2 | 4/2012 | Abolfathi et al. |
| 8,180,080 B2 | 5/2012 | Polinske et al. |
| 8,494,197 B2 | 7/2013 | Polinske et al. |
| 8,565,457 B2 | 10/2013 | Polinske et al. |
| 8,699,733 B2 | 4/2014 | Polinske et al. |
| 8,737,658 B2 | 5/2014 | Helgeson et al. |
| 9,167,360 B2 | 10/2015 | Polinske et al. |
| 9,179,227 B2 | 11/2015 | Polinske et al. |
| 9,264,826 B2 | 2/2016 | Helgeson et al. |
| 9,294,850 B2 | 3/2016 | Polinske et al. |
| 9,451,371 B2 | 9/2016 | Polinske |
| 9,602,934 B2 | 3/2017 | Sanguino et al. |
| 9,743,199 B2 | 8/2017 | Polinske et al. |
| 2001/0007050 A1 | 7/2001 | Adelman |
| 2002/0000944 A1 | 1/2002 | Sabet et al. |
| 2002/0037756 A1 | 3/2002 | Jacobs et al. |
| 2002/0090099 A1 | 7/2002 | Hwang |
| 2003/0122713 A1 | 7/2003 | Morris |
| 2004/0027296 A1 | 2/2004 | Gerber |
| 2004/0028251 A1 | 2/2004 | Kasztelan et al. |
| 2004/0044382 A1 | 3/2004 | Ibrahim |
| 2004/0120540 A1 | 6/2004 | Mullenborn et al. |
| 2004/0176815 A1 | 9/2004 | Janzig et al. |
| 2004/0196190 A1 | 10/2004 | Mendolia et al. |
| 2005/0099341 A1 | 5/2005 | Zhang et al. |
| 2005/0100183 A1 | 5/2005 | Ballisager et al. |
| 2005/0244024 A1 | 11/2005 | Fischer et al. |
| 2006/0055531 A1 | 3/2006 | Cook et al. |
| 2006/0145931 A1 | 7/2006 | Ranta |
| 2006/0227989 A1 | 10/2006 | Polinske |
| 2007/0080889 A1 | 4/2007 | Zhang |
| 2007/0086610 A1 | 4/2007 | Niederdrank |
| 2007/0188402 A1 | 8/2007 | Knudsen et al. |
| 2007/0229369 A1 | 10/2007 | Platz |
| 2008/0056520 A1 | 3/2008 | Christensen et al. |
| 2008/0095387 A1 | 4/2008 | Niederdrank et al. |
| 2008/0150816 A1 | 6/2008 | Rahola et al. |
| 2008/0272980 A1 | 11/2008 | Adel et al. |
| 2008/0287084 A1 | 11/2008 | Krebs et al. |
| 2009/0041285 A1 | 2/2009 | Parkins et al. |
| 2009/0085819 A1 | 4/2009 | Watanabe |
| 2009/0136068 A1 | 5/2009 | Koo et al. |
| 2009/0214064 A1 | 8/2009 | Wu et al. |
| 2009/0226786 A1 | 9/2009 | Selcuk et al. |
| 2010/0074461 A1 | 3/2010 | Polinske |
| 2010/0158291 A1 | 6/2010 | Polinske et al. |
| 2010/0158293 A1 | 6/2010 | Polinske et al. |
| 2010/0158294 A1 | 6/2010 | Helgeson et al. |
| 2010/0158295 A1 | 6/2010 | Polinske et al. |
| 2010/0171667 A1 | 7/2010 | Knudsen |
| 2010/0202639 A1 | 8/2010 | Christensen et al. |
| 2011/0117974 A1* | 5/2011 | Spitalnik ................ H01R 31/06 455/573 |
| 2011/0228947 A1 | 9/2011 | Killion et al. |
| 2012/0308058 A1 | 12/2012 | Polinske |
| 2014/0016806 A1 | 1/2014 | Polinske |
| 2014/0016807 A1 | 1/2014 | Polinske et al. |
| 2014/0307904 A1 | 10/2014 | Polinske et al. |
| 2014/0348362 A1 | 11/2014 | Helgeson et al. |
| 2015/0016646 A1 | 1/2015 | Polinske et al. |
| 2016/0183013 A1 | 6/2016 | Polinske et al. |
| 2016/0192091 A1 | 6/2016 | Polinske et al. |
| 2016/0337767 A1 | 11/2016 | Helgeson et al. |
| 2016/0345109 A1 | 11/2016 | Polinske et al. |
| 2017/0070829 A1 | 3/2017 | Polinske |
| 2017/0230768 A1 | 8/2017 | Polinske et al. |

FOREIGN PATENT DOCUMENTS

| | | |
|---|---|---|
| EP | 0389559 A1 | 10/1990 |
| EP | 424796 A2 | 5/1991 |
| EP | 0594375 A2 | 4/1994 |
| EP | 1250026 A1 | 10/2002 |
| EP | 1389035 A1 | 2/2004 |
| EP | 1460712 A1 | 9/2004 |
| EP | 1587344 A2 | 10/2005 |
| EP | 1851823 B1 | 8/2006 |
| EP | 1708306 A1 | 10/2006 |
| EP | 1821571 A1 | 8/2007 |
| EP | 1708306 B1 | 5/2012 |
| EP | 2200120 B1 | 10/2013 |
| EP | 2200348 B1 | 5/2014 |
| JP | 02300894 A | 12/1990 |
| JP | 2002238098 A | 8/2002 |
| JP | 2002238100 A | 8/2002 |
| WO | WO-9213430 A1 | 8/1992 |
| WO | WO-9306666 A1 | 4/1993 |
| WO | WO-9731431 A1 | 8/1997 |
| WO | WO-9949815 A1 | 10/1999 |
| WO | WO-2001043497 A1 | 6/2001 |
| WO | WO-0173864 A2 | 10/2001 |
| WO | WO-0173865 A2 | 10/2001 |
| WO | WO-0173868 A2 | 10/2001 |
| WO | WO-0173870 A2 | 10/2001 |
| WO | WO-0173883 A2 | 10/2001 |

(56) References Cited

FOREIGN PATENT DOCUMENTS

| WO | WO-0173957 A2 | 10/2001 |
|----|---------------|---------|
| WO | WO-2004093002 A1 | 10/2004 |
| WO | WO-2008023860 A1 | 2/2008 |

OTHER PUBLICATIONS

"U.S. Appl. No. 11/357,751, Non-Final Office Action dated May 23, 2008", 9 pgs.
"U.S. Appl. No. 11/357,751, Non-Final Office Action dated Aug. 28, 2007", 9 pgs.
"U.S. Appl. No. 11/357,751, Notice of Allowance dated Aug. 5, 2009", 7 pgs.
"U.S. Appl. No. 11/357,751, Preliminary Amendment dated Aug. 28, 2006", 6 pgs.
"U.S. Appl. No. 11/357,751, Response filed Feb. 28, 2008 to Non-Final Office Action dated Aug. 28, 2007", 10 pgs.
"U.S. Appl. No. 11/357,751, Response filed May 18, 2009 to Final Office Action dated Feb. 17, 2009", 9 pgs.
"U.S. Appl. No. 11/357,751, Response filed Nov. 24, 2008 to Non Final Office Action dated May 23, 2008", 13 pgs.
"U.S. Appl. No. 12/340,591, Final Office Action dated Mar. 14, 2012", 7 pgs.
"U.S. Appl. No. 12/340,591, Non Final Office Action dated Sep. 12, 2011", 7 pgs.
"U.S. Appl. No. 12/340,591, Notice of Allowance dated Jan. 21, 2014", 8 pgs.
"U.S. Appl. No. 12/340,591, Notice of Allowance dated Sep. 5, 2013", 9 pgs.
"U.S. Appl. No. 12/340,591, Response filed Jan. 12, 2012 to Non Final Office Action dated Sep. 12, 2011", 7 pgs.
"U.S. Appl. No. 12/340,591, Response filed Aug. 14, 2012 to Final Office Action dated Mar. 14, 2012", 11 pgs.
"U.S. Appl. No. 12/340,600, Final Office Action dated Mar. 27, 2012", 6 pgs.
"U.S. Appl. No. 12/340,600, Non Final Office Action dated Sep. 14, 2011", 6 pgs.
"U.S. Appl. No. 12/340,600, Notice of Allowance dated Mar. 19, 2013", 5 pgs.
"U.S. Appl. No. 12/340,600, Preliminary Amendment filed Apr. 6, 2009", 7 pgs.
"U.S. Appl. No. 12/340,600, Response filed Jan. 17, 2012 to Non Final Office Action dated Sep. 14, 2011", 10 pgs.
"U.S. Appl. No. 12/340,600, Response filed Aug. 27, 2012 to Final Office Action dated Mar. 27, 2012", 8 pgs.
"U.S. Appl. No. 12/340,604, 312 Amendment filed Sep. 19, 2013", 3 pgs.
"U.S. Appl. No. 12/340,604, Final Office Action dated Feb. 21, 2013", 17 pgs.
"U.S. Appl. No. 12/340,604, Final Office Action dated Mar. 1, 2012", 14 pgs.
"U.S. Appl. No. 12/340,604, Non Final Office Action dated Aug. 30, 2012", 15 pgs.
"U.S. Appl. No. 12/340,604, Non Final Office Action dated Oct. 11, 2011", 11 pgs.
"U.S. Appl. No. 12/340,604, Notice of Allowance dated Jun. 19, 2013", 18 pgs.
"U.S. Appl. No. 12/340,604, Preliminary Amendment filed Apr. 6, 2009", 7 pgs.
"U.S. Appl. No. 12/340,604, PTO Response to 312 Amendment dated Sep. 24, 2013", 2 pgs.
"U.S. Appl. No. 12/340,604, Response filed Jan. 11, 2012 to Non Final Office Action dated Oct. 11, 2011", 10 pgs.
"U.S. Appl. No. 12/340,604, Response filed May 21, 2013 to Final Office Action dated Feb. 21, 2013", 9 pgs.
"U.S. Appl. No. 12/340,604, Response filed Aug. 1, 2012 to Final Office Action dated Mar. 1, 2012", 9 pgs.
"U.S. Appl. No. 12/340,604, Response filed Dec. 31, 2012 to Non Final Office Action dated Aug. 30, 2012", 8 pgs.

"U.S. Appl. No. 12/550,821, Non Final Office Action dated Sep. 1, 2011", 9 pgs.
"U.S. Appl. No. 12/550,821, Notice of Allowance dated Mar. 19, 2012", 9 pgs.
"U.S. Appl. No. 12/550,821, Notice of Allowance dated Apr. 10, 2012", 7 pgs.
"U.S. Appl. No. 12/550,821, Response filed Mar. 1, 2012 to Non Final Office Action dated Sep. 1, 2011", 6 pgs.
"U.S. Appl. No. 12/638,720, Final Office Action dated Mar. 2, 2012", 17 pgs.
"U.S. Appl. No. 12/638,720, Non Final Office Action dated Jul. 30, 2013", 23 pgs.
"U.S. Appl. No. 12/638,720, Non Final Office Action dated Oct. 17, 2011", 14 pgs.
"U.S. Appl. No. 12/638,720, Notice of Allowance dated Nov. 27, 2013", 17 pgs.
"U.S. Appl. No. 12/638,720, Response filed Jan. 17, 2012 to Non Final Office Action dated Oct. 17, 2011", 9 pgs.
"U.S. Appl. No. 12/638,720, Response filed Aug. 1, 2012 to Final Office Action dated Mar. 2, 2012", 9 pgs.
"U.S. Appl. No. 12/638,720, Response filed Oct. 30, 2013 to Non Final Office Action dated Jul. 30, 2013", 10 pgs.
"U.S. Appl. No. 12/638,720, Supplemental Notice of Allowability dated Feb. 4, 2014", 2 pgs.
"U.S. Appl. No. 13/410,042, Non Final Office Action dated Apr. 11, 2013", 10 pgs.
"U.S. Appl. No. 13/948,040, Non Final Office Action dated Dec. 10, 2014", 8 pgs.
"U.S. Appl. No. 13/948,040, Notice of Allowance dated May 28, 2015", 7 pgs.
"U.S. Appl. No. 13/948,040, Preliminary Amendment filed Mar. 13, 2014", (Mar. 13, 2014), 6 pgs.
"U.S. Appl. No. 13/948,040, Response filed Mar. 10, 2015 to Non Final Office Action dated Dec. 10, 2014", 9 pgs.
"U.S. Appl. No. 14/024,409, Advisory Action dated Dec. 31, 2015", 3 pgs.
"U.S. Appl. No. 14/024,409, Final Office Action dated Oct. 1, 2015", 12 pgs.
"U.S. Appl. No. 14/024,409, Non Final Office Action dated Jan. 22, 2015", 8 pgs.
"U.S. Appl. No. 14/024,409, Notice of Allowance dated May 23, 2016", 7 pgs.
"U.S. Appl. No. 14/024,409, Pre-Appeal Brief filed Feb. 1, 2016", 3 pgs.
"U.S. Appl. No. 14/024,409, Response filed Jun. 22, 2015 to Non Final Office Action dated Jan. 22, 2015", 6 pgs.
"U.S. Appl. No. 14/024,409, Response filed Dec. 1, 2015 to Final Office Action dated Oct. 1, 2015", 8 pgs.
"U.S. Appl. No. 14/031,906, Advisory Action dated May 20, 2015", 3 pgs.
"U.S. Appl. No. 14/031,906, Final Office Action dated Mar. 11, 2015", 8 pgs.
"U.S. Appl. No. 14/031,906, Non Final Office Action dated Jul. 31, 2014", 7 pgs.
"U.S. Appl. No. 14/031,906, Notice of Allowance dated Jun. 26, 2015", 6 pgs.
"U.S. Appl. No. 14/031,906, Preliminary Amendment filed Sep. 20, 2013", (Sep. 20, 2013), 20 pgs.
"U.S. Appl. No. 14/031,906, Response filed May 11, 2015 to Final Office Action dated Mar. 11, 2015", 6 pgs.
"U.S. Appl. No. 14/031,906, Response filed Oct. 30, 2014 to Non Final Office Action dated Jul. 31, 2014", 6 pgs.
"U.S. Appl. No. 14/252,398, Final Office Action dated Aug. 11, 2015", 6 pgs.
"U.S. Appl. No. 14/252,398, Non Final Office Action dated Mar. 5, 2015", 10 pgs.
"U.S. Appl. No. 14/252,398, Notice of Allowance dated Nov. 10, 2015", 6 pgs.
"U.S. Appl. No. 14/252,398, Preliminary Amendment filed Oct. 6, 2014", 5 pgs.
"U.S. Appl. No. 14/252,398, Response filed Jun. 5, 2015 to Non Final Office Action dated Mar. 5, 2015", 7 pgs.

(56) References Cited

OTHER PUBLICATIONS

"U.S. Appl. No. 14/252,398, Response filed Oct. 12, 2015 to Final Office Action dated Aug. 11, 2015", 6 pgs.
"U.S. Appl. No. 14/287,334, Final Office Action dated Jul. 30, 2015", 4 pgs.
"U.S. Appl. No. 14/287,334, Non Final Office Action dated Mar. 12, 2015", 8 pgs.
"U.S. Appl. No. 14/287,334, Notice of Allowance dated Oct. 13, 2015", 6 pgs.
"U.S. Appl. No. 14/287,334, Preliminary Amendment filed Aug. 11, 2014", 6 pgs.
"U.S. Appl. No. 14/287,334, Response filed Jan. 10, 2014 to Restriction Requirement dated Nov. 13, 2014", 6 pgs.
"U.S. Appl. No. 14/287,334, Response filed Jun. 12, 2015 to Non Final Office Action dated Mar. 12, 2015", 9 pgs.
"U.S. Appl. No. 14/287,334, Response filed Sep. 30, 2015 to Final Office Action dated Jul. 30, 2015", 4 pgs.
"U.S. Appl. No. 14/287,334, Restriction Requirement dated Nov. 13, 2014", 6 pgs.
"U.S. Appl. No. 14/886,629, Non Final Office Action dated Dec. 28, 2016", 7 pgs.
"U.S. Appl. No. 14/927,770, Non Final Office Action dated Apr. 22, 2016", 9 pgs.
"U.S. Appl. No. 14/927,770, Notice of Allowance dated Nov. 8, 2016", 7 pgs.
"U.S. Appl. No. 14/927,770, Response filed Jul. 20, 2016 to Non Final Office Action dated Apr. 22, 2016", 6 pgs.
"U.S. Appl. No. 15/043,800, Non Final Office Action dated Sep. 23, 2016", 9 pgs.
"U.S. Appl. No. 15/076,479, Corrected Notice of Allowance dated Jul. 25, 2017", 2 pgs.
"U.S. Appl. No. 15/076,479, Final Office Action dated Jan. 17, 2017", 6 pgs.
"U.S. Appl. No. 15/076,479, Non Final Office Action dated Sep. 2, 2016", 8 pgs.
"U.S. Appl. No. 15/076,479, Notice of Allowance dated Apr. 14, 2017", 8 pgs.
"U.S. Appl. No. 15/076,479, Response Filed Mar. 6, 2017 to Final Office Action dated Jan. 17, 2017", 6 pgs.
"U.S. Appl. No. 15/076,479, Response Filed Dec. 1, 2016 to Non Final Office Action dated Sep. 2, 2016", 7 pgs.
"U.S. Appl. No. 15/269,315, Non Final Office Action dated Aug. 4, 2017", 19 pgs.
"U.S. Appl. No. 15/269,315, Preliminary Amendment filed Nov. 29, 2016", 5 pgs.
"U.S. Appl. No. 15/269,315, Response filed Nov. 6, 2017 to Non Final Office Action dated Aug. 4, 2017", 8 pgs.
"U.S. Appl. No. 15/463,975 Preliminary Amendment filed Apr. 28, 2017", 5 pgs.
"U.S. Appl. No. 15/463,975, Non Final Office Action dated Sep. 19, 2017", 11 pgs.
"U.S. Appl. No. 15/463,975, Response Filed Dec. 19, 2017 to Non Final Office Action dated Sep. 19, 2017", 7 pgs.
"European Application Serial No. 06251644.8, European Office Action dated Mar. 11, 2008", 4 pgs.
"European Application Serial No. 06251644.8, European Search Report dated Jun. 21, 2006", 5 pgs.
"European Application Serial No. 06251644.8, Office Action dated May 11, 2007", 1 pg.
"European Application Serial No. 06251644.8, Response filed Sep. 22, 2008 to Office Action dated Mar. 11, 2008", 3 pgs.
"European Application Serial No. 06251644.8, Response filed Nov. 21, 2007 to Office Action dated May 11, 2007", 44 pgs.
"European Application Serial No. 06251644.8, Search Report dated Jun. 15, 2006", 2 pgs.
"European Application Serial No. 06251644.8, Summon to attend Oral Proceeding dated Mar. 15, 2011", 4 pgs.
"European Application Serial No. 06251644.8, Written Submissions filed Jun. 1, 2011 in response to Summon to attend Oral Proceeding mailed Mar. 15, 2011", 25 pgs.
"European Application Serial No. 09252775.3, Examination Notification dated Jan. 22, 2013".
"European Application Serial No. 09252775.3, Extended European Search Report dated Apr. 19, 2010", 6 pgs.
"European Application Serial No. 09252775.3, Response filed May 28, 2013 to Examination Notification Art. 94(3) dated Jan. 22, 2013", 12 pgs.
"European Application Serial No. 09252775.3, Response filed Dec. 22, 2010 to Search Report dated Apr. 23, 2010", 14 pgs.
"European Application Serial No. 09252796.9, Examination Notification Art. 94(3) dated Mar. 13, 2013", 4 pgs.
"European Application Serial No. 09252796.9, Extended European Search Report dated May 24, 2011", 6 Pgs.
"European Application Serial No. 09252796.9, Response filed Jul. 4, 2013 to Office Action dated Mar. 13, 2013", 9 pgs.
"European Application Serial No. 09252796.9, Response filed Dec. 14, 2011 to Search Report dated Jun. 28, 2011", 7 pgs.
"European Application Serial No. 09252830.6, Extended European Search Report dated May 24, 2011", 6 pgs.
"European Application Serial No. 09252830.6, Extended Search Report Response filed Dec. 15, 2011", 9 pgs.
Chen, W T, et al., "Numerical computation of the EM coupling between a circular loop antenna and a full-scale human-body model", IEEE Transactions on Microwave Theory and Techniques, 46(10), (Oct. 1998), 1516-1520.
"U.S. Appl. No. 15/269,315, Advisory Action dated May 17, 2018", 3 pgs.
"U.S. Appl. No. 15/269,315, Response Filed Apr. 16, 2018 to Final Office Action dated Feb. 16, 2018", 8 pgs.
"U.S. Appl. No. 15/463,975, Advisory Action dated Jun. 26, 2018", 3 pgs.
"U.S. Appl. No. 15/463,975, Final Office Action dated Apr. 13, 2018", 12 pgs.
"U.S. Appl. No. 15/463,975, Response Filed Jun. 6, 2018 to Final Office Action dated Apr. 13, 2018", 7 pgs.

* cited by examiner

THREE DIMENSIONAL SUBSTRATE FOR HEARING ASSISTANCE DEVICES

PRIORITY APPLICATION

This application is a continuation-in-part and claims the benefit of priority to U.S. patent application Ser. No. 15/043,800, filed Feb. 15, 2016, which is a continuation of U.S. patent application Ser. No. 14/287,334, filed May 27, 2014, now issued as U.S. Pat. No. 9,264,826, which is a continuation of U.S. patent application Ser. No. 12/340,591, filed Dec. 19, 2008, now issued as U.S. Pat. No. 8,737,658, all of which are hereby incorporated by reference herein in their entirety.

FIELD

The present subject matter relates to hearing assistance devices and more particularly to three dimensional substrates for hearing assistance devices.

BACKGROUND

Hearing assistance device manufacturers, including hearing aid manufacturers, have adopted thick film hybrid technologies that build up layers of flat substrates with semiconductor die and passive electronic components attached to each substrate using either surface mount, flip-chip, or wire-bond technologies that interconnect the various die. Conductors such as wires or flex circuits are attached to pads on the hybrid module after the hybrid module is assembled and tested. The conductors connect various electro-mechanical, electro-acoustical and electro-chemical devices to the active electronics within the hybrid. Connection points may be provided for a battery, receiver/speaker, switch, volume control, microphones, programming interface, external audio interface and wireless electronics including an antenna. Recent advances, such as the addition of wireless technology, have stressed designers' ability to accommodate additional advances using expanded hybrid circuits because of size limitations within a device housing. Growing the hybrid to add features, functions and new interfaces, increases the overall size and complexity of a hearing instrument. Expanding the current hybrid may not be a viable option since the hybrid circuit is made up of finite layers of rectangular plains. The larger, complex circuits compete with most manufacturer's goal of small and easy to use hearing assistance devices.

SUMMARY

The above-mentioned problems and others not expressly discussed herein are addressed by the present subject matter and will be understood by reading and studying this specification. The present subject matter relates to a hearing assistance device for a user comprising a housing, a substrate disposed in the housing, the substrate adapted to conform around a battery of the hearing assistance device, and hearing assistance electronics mounted to the substrate. Various embodiments include, but are not limited to, embodiments where the substrate is adapted to structurally receive the battery, embodiments where the substrate is adapted to conform around a battery compartment, and embodiments where the substrate is adapted to connect to contacts integral to a battery compartment. Various designs include, but are not limited to, substrates with integral antennae. Various embodiments include a flexible antenna configured to conform around a portion of the substrate, and spring loaded electrical contacts on the substrate, the contacts configured to mechanically engage and electrically connect to the flexible antenna. The embodiments include a variety of heating assistance device applications and housings, such as an in-the-canal hearing aid, an in-the-ear hearing aid, a completely-in-the-canal hearing aid, a behind-the-ear hearing aid, and a receiver-in-the-canal hearing aid.

This Summary is an overview of some of the teachings of the present application and not intended to be an exclusive or exhaustive treatment of the present subject matter. Further details about the present subject matter are found in the detailed description and appended claims. The scope of the present invention is defined by the appended claims and their legal equivalents.

DETAILED DESCRIPTION

The following detailed description of the present subject matter relates to the accompanying drawings which show, by way of illustration, specific aspects and embodiments in which the present subject matter may be practiced. These embodiments are described in sufficient detail to enable those skilled in the art to practice the present subject matter. References to "an", "one", or "various" embodiments in this disclosure are not necessarily to the same embodiment, and such references contemplate more than one embodiment. The following detailed description is, therefore, not to be taken in a limiting sense, and the scope is defined only by the appended claims, along with the full scope of legal equivalents to which such claims are entitled.

In various embodiments, the 3D substrate defines a battery compartment for a hearing assistance device and provides structural rigidity to support a battery or other power source, such as a super capacitor for example. In some embodiments, the 3D substrate is formed from a flexible substrate with contacts which is wrapped around a battery compartment (for example, a battery drawer assembly designed to mechanically hold the battery). In such designs, the contacts can be arranged for direct connection to the battery or other power source. In some embodiments, the battery compartment includes battery contacts which are rigidly mounted to the compartment. In such designs, the 3D substrate wraps around the battery compartment and makes contact with the battery contacts of the battery compartment. In some embodiments, a gasket is used to form a water resistant or moisture resistant seal for the battery compartment. Other seals, including, but not limited to, glues and rubber or polymer seals may be employed to form water resistant or moisture resistant seals without departing from the scope of the present subject matter. The 3D substrate can be used with a variety of hearing assistance device housings including, but not limited to, behind-the-ear, in-the-ear, on-the-ear, in-the-canal and completely-in-the-canal housings, as well as housings used for receiver-in-the-canal and cochlear implant applications. Other variations are possible without departing from the scope of the present subject matter.

Figure 1:
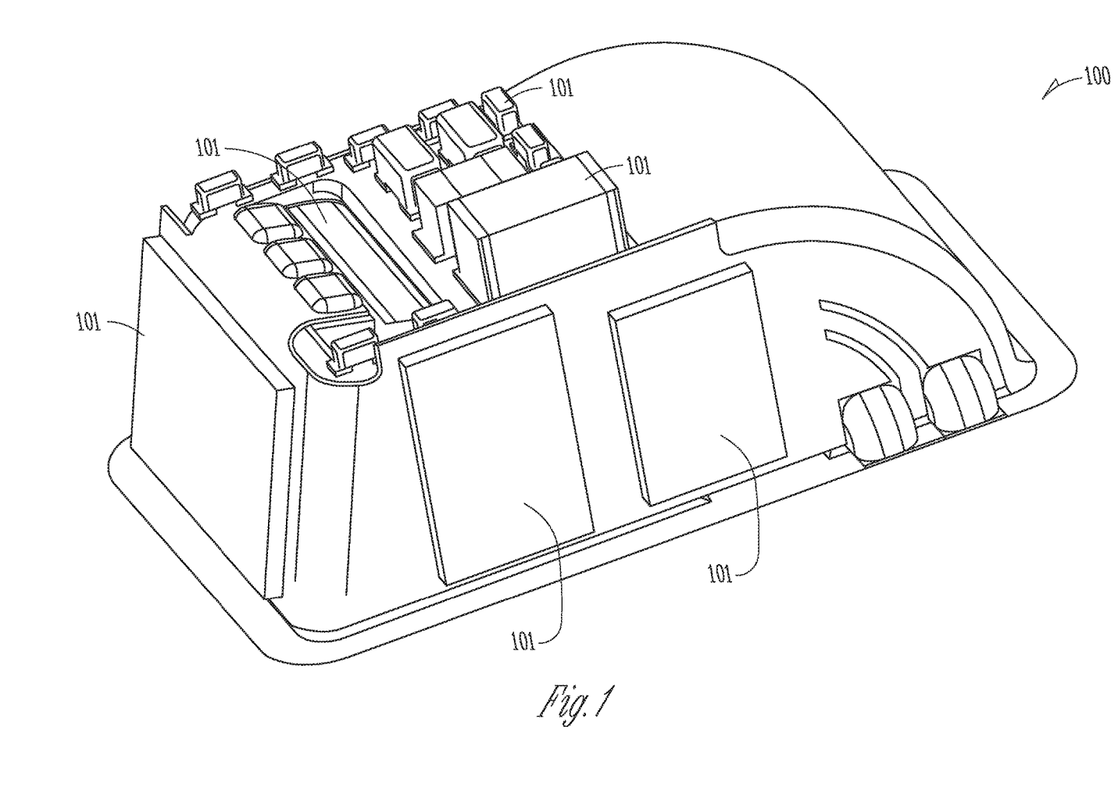
FIG. 1 shows a three dimensional (3D) substrate and hearing assistance electronics according to one embodiment of the present subject matter.

FIG. 1 shows a three dimensional (3D) substrate 100 and hearing assistance electronics 101 according to one embodiment of the present subject matter. The 3D substrate includes contours that form internal housing surfaces of a hearing assistance device. The illustrated embodiment shows a 3D substrate 100 that conforms to a battery for a hearing assistance device. The 3D substrate 100 provides surfaces for mounting electronics 101 in areas, such as around a battery, where mounting a flat, thick film substrate and attached electronics are not possible. Examples of electronics mounted to the 3D substrate include, but are not limited to, active electronics, passive electronics, digital electronics, analog electronics or combinations thereof.

In various embodiments, a standard 3D substrate is used for custom, physically fitted hearing assistance devices. The 3D shape of the substrate is developed from digital imaging data of multiple custom hearing assistance devices such that a standard 3D substrate takes into account extreme space restrictions of a population of custom, physically fitted hearing assistance devices. Although the standard 3D substrate may not accommodate every custom, physically fitted hearing assistance device, it reduces the custom electronic assembly of at least a portion of the demand, thus reducing cost and, in turn, increasing access to custom fitted devices.

Figure 2:
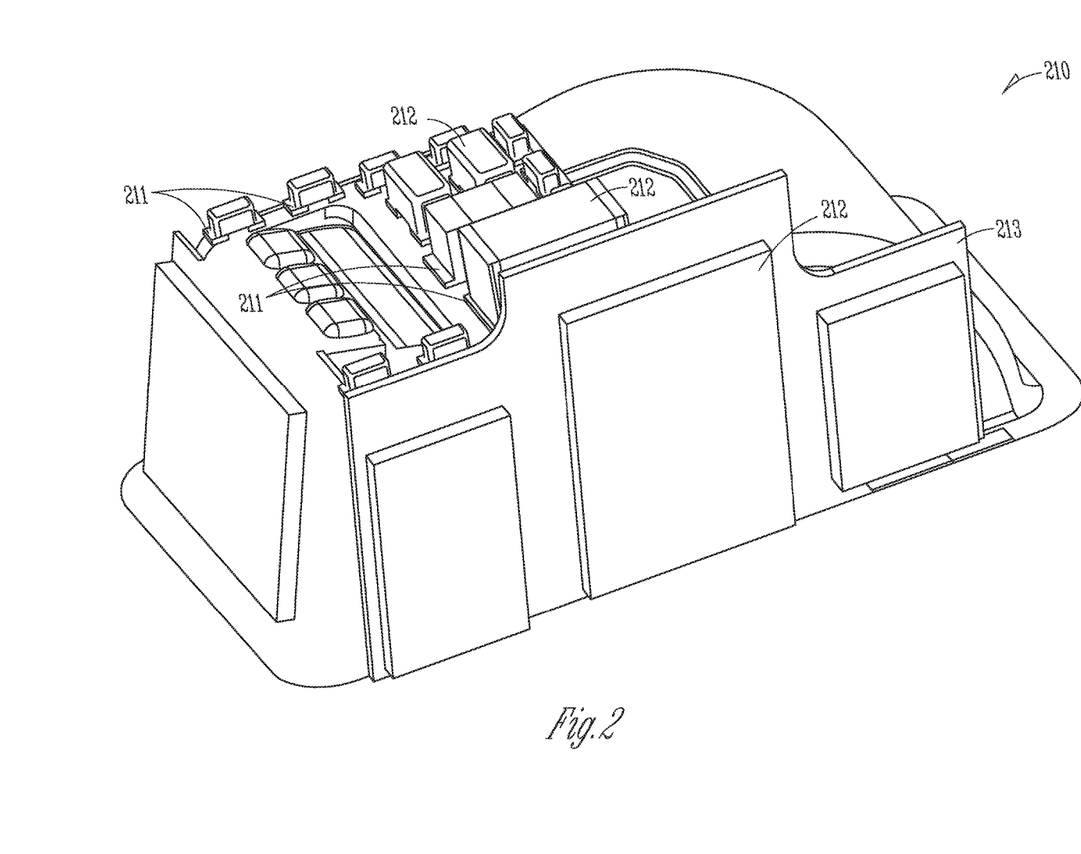
FIG. 2 shows a 3D substrate according to one embodiment of the present subject matter.

FIG. 2 shows a 3D substrate 210 according to one embodiment of the present subject matter. The 3D substrate 210 includes integrated conductive elements 211 for connecting electronic components 212 to the substrate and interconnecting the electronic components. The integrated conductive elements provide, among other things, interconnection of components, isolation of circuits, and shielding and grounding planes to improve performance. The integrated conductive elements 211 include, but not limited to, traces, mounting pads and wire bonding pads. The conductive elements 211 are integrated with the substrate using methods including printing and plating. Other methods of integrating conductive elements with the 3D substrate are possible without departing from the scope of the present subject matter. In various embodiments, the substrate includes areas for mounting and connecting other electromechanical, electro-chemical and accessory devices including, but not limited to, receivers, wiring harnesses for remote receivers such as a receiver for wearing in an ear canal, microphones, switches, interface connectors, antennas, battery contacts or combinations thereof.

Electronic components of the hearing assistance device are mounted to and distributed about the 3D substrate. The technology allows more efficient use of the interior space of the hearing assistance device. In various embodiments, a 3D substrate provides mounting surfaces and interconnections for multiple features of a hearing assistance device. Upon assembly, only the electronics supporting the features ordered for that device are mounted and connected. In some embodiments, the 3D substrate only provides mounting areas for limited features. In some embodiments, allowing only limited features provides additional volume within the housing of the hearing assistance device to provide other features or expand existing features. For example, a 3D substrate may not provide space for wireless electronics, but accommodates additional memory. In some embodiments, the 3D substrate is used with flexible circuit technology. For example, a flexible circuit substrate 213 is used to mount and interconnect electronics 212, such as an ASIC die. The flexible circuit 213 is then mounted and connected to the 3D substrate 210 for interconnection to other hearing assistance electronics 212.

In various embodiments, the hearing assistance device includes a 3D substrate and wireless communication electronics. An antenna for transmitting, receiving or transmitting and receiving data with the wireless electronics is integrated with the 3D substrate. In some embodiments, the antenna is integrated along a perimeter area of the substrate or where there is sufficient room. In some embodiments, the integrated antenna follows the contours of the 3D substrate. In some embodiments, the antenna is inserted in a groove on a faceplate mounting surface to provide mounting stability and rigidity to the 3D folded substrate.

Figure 3:
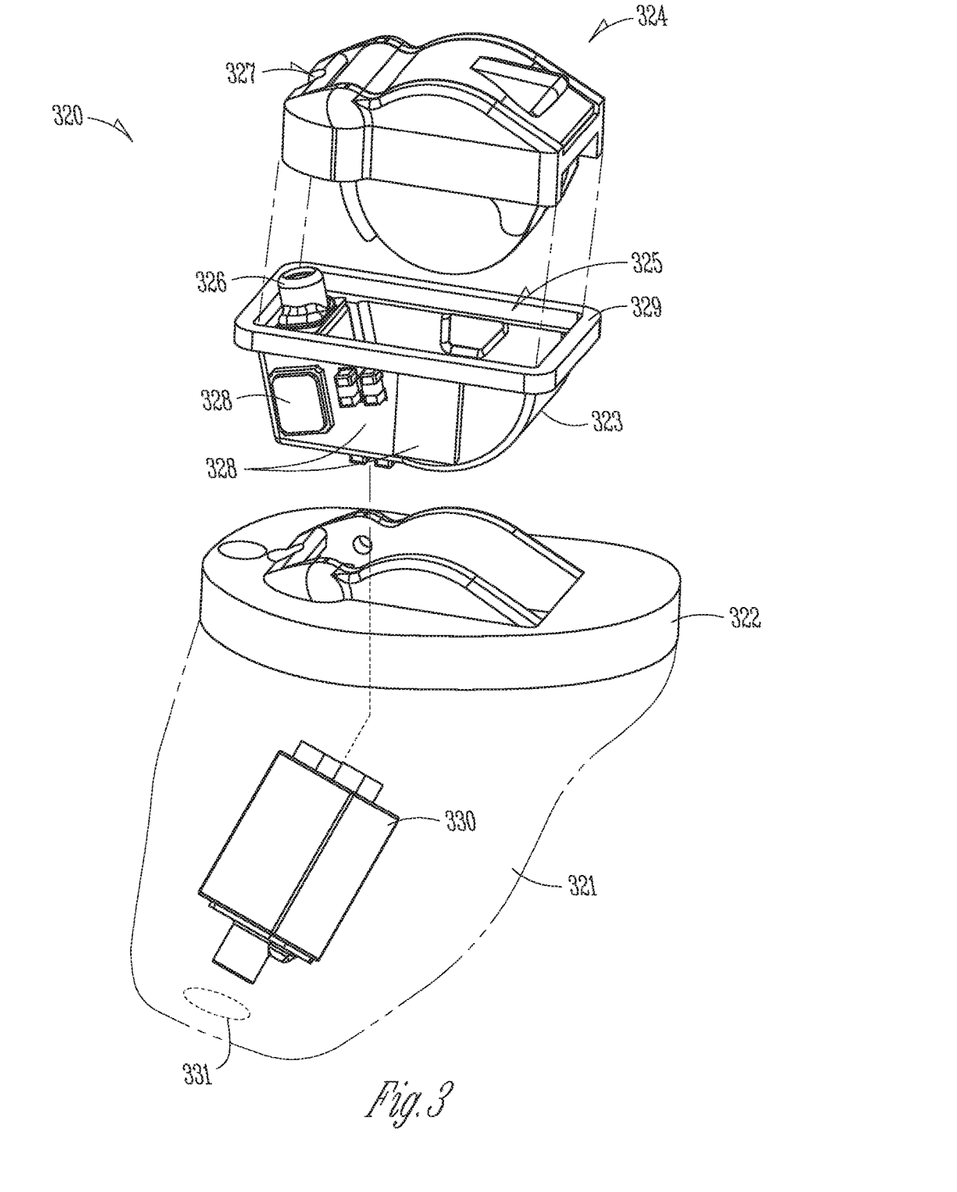
FIG. 3 shows a hearing assistance device with a 3D substrate according to one embodiment of the present subject matter.

FIG. 3 shows a hearing assistance device with a 3D substrate according to one embodiment of the present subject matter. The hearing assistance device 320 includes a shell 321, faceplate 322, 3D substrate 323 and a battery door assembly 324, The 3D substrate 323 defines a battery well 325 and an area for mounting a microphone 326 and providing access to a microphone port 327 in the battery door assembly 324. The 3D substrate 323 includes hearing assistance electronics 328 mounted to the 3D substrate 323. A microphone 326 is mounted to the substrate 323 and electrically connected to the hearing assistance electronics 328. Conductive elements, including traces and bonding pads, are integrated with the 3D substrate 323 to interconnect the hearing electronics 328 and the microphone 326. In various embodiments, the 3D substrate includes integrated battery contacts for connecting a battery to the hearing assistance electronics.

During assembly, the 3D substrate 323 extends into the hearing assistance device shell 321 through an opening in the faceplate 322. In various embodiments, the substrate 323 includes a lip 329 that attaches to and seals the opening in the faceplate 322. The faceplate 322 is attached to the hearing assistance device shell 321. In some embodiments, the lip 329 provides a watertight seal for a waterproof hearing assistance device 320. In various embodiments, the 3D substrate is rigid. In some embodiments, a gasket is used to form a water resistant or moisture resistant seal for the battery compartment. Other seals, including, but not limited to, glues and rubber or polymer seals may be employed to form water resistant or moisture resistant seals without departing from the scope of the present subject matter.

In the illustrated embodiment, a speaker 330 is connected to the 3D substrate 323. The speaker is positioned at or near a speaker opening 331 in the shell 321 to play sounds to a user's ear. In some embodiments, the speaker 330, or receiver in the case of a hearing aid, is mounted and electrically connected to the 3D substrate 323 and the hearing assistance electronics 328. In various embodiments, a programming port is electrically connected to the hearing electronics mounted on the 3D substrate. In some embodiments, the programming port is mounted to the 3D substrate. It is understood that other electronic components mounted to and/or connected to the 3D substrate are possible without departing from the present subject matter. Examples of other electronic components include, but are not limited to, switches, visual indicators, volume controls, mode selectors or combinations thereof. The 3D substrate can be used with a variety of hearing assistance device housings including, but not limited to, behind-the-ear, in-the-ear, on-the-ear, in-the-canal and completely-in-the-canal housings, as well as housings used for receiver-in-the-canal and cochlear implant applications.

Figures 4A, 4B:
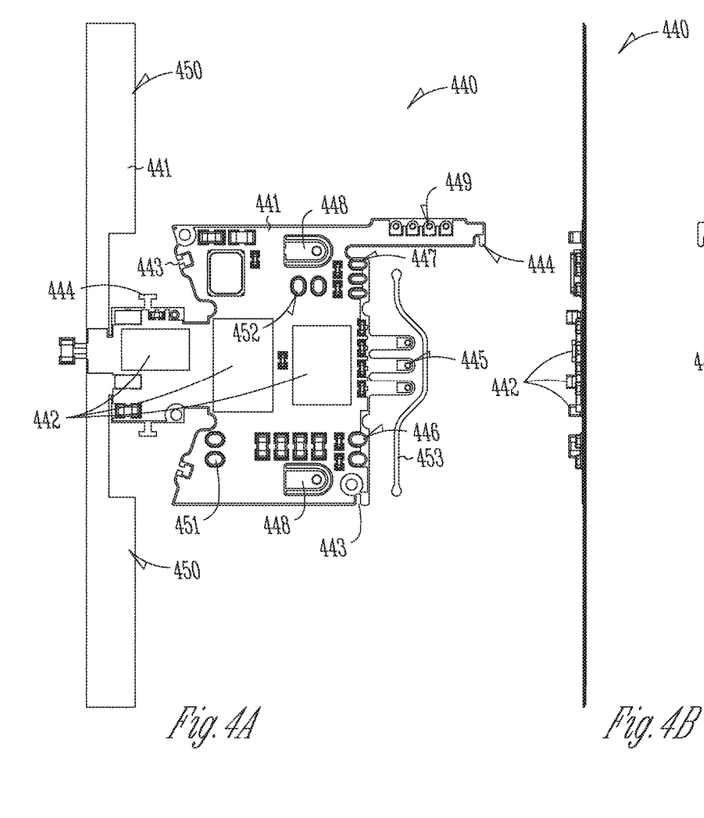
FIGS. 4A-4C show various views of a partially assembled 3D substrate according to one embodiment of the present subject matter.
Figure 4C:
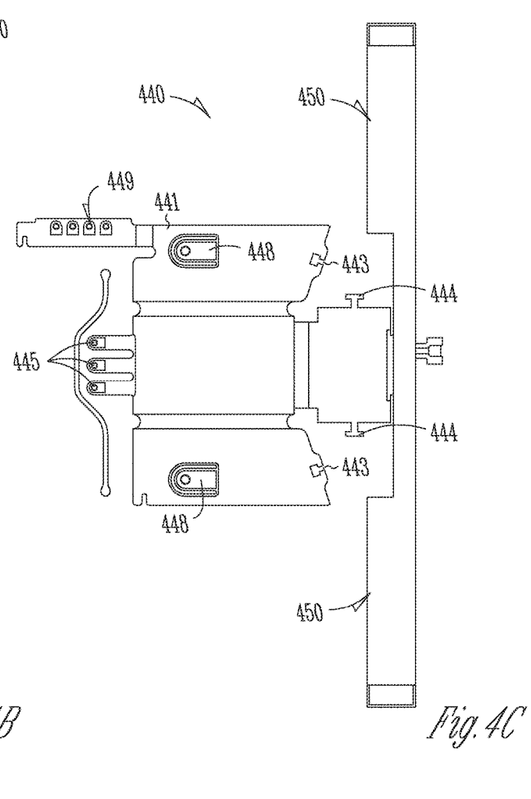

FIGS. 4A-4C show various views of a partially assembled 3D substrate 440 according to one embodiment of the present subject matter. FIG. 4A shows a plan view of the component or exterior side of the 3D substrate. FIG. 4C shows the interior side of the 3D substrate. FIG. 4B shows a side view of the substantially flat partially assembled 3D substrate. The 3D substrate includes various electrical components 442 assembled to a foldable substrate 441 and form at least a portion of the hearing assistance electronics for a hearing assistance device. The electronic components 442 include both active and passive components interconnected using conductive traces integrated with the foldable substrate 441. Upon further assembly, the substrate 441 is folded into a 3-dimensional shape. Various slots 443 and tabs 444 are engaged to add structural integrity to the 3D substrate 440 and to maintain the folded shape. The 3D substrate includes various contact areas for connecting to other hearing assistance device components including but not limited to, microphones 445, speaker 446, telecoil 447, battery 448, an external programmer interface 449, controls 451, 452 such as switches and dials or combinations thereof. Methods of connecting components to the contact areas of the substrate include, but are not limited to, solder, compression connections, direct contact and combinations thereof. It is understood that other methods for connecting components to the contact areas of the substrate are possible without departing from the scope of the present subject matter. In various embodiments, the substrate includes an antenna 450 for wireless communications. In one embodiment, the antenna 450 is integrated along a perimeter area of the substrate.

In various embodiments, the substrate 441 is made of a flexible material including, but not limited to, Liquid Crystal polymer (LCP), polyphtalamide (PPA), Teflon, thin plated plastic or combinations thereof. In some embodiments, the substrate is in a rigid 3D form using plated plastic or ceramic. In various embodiments, the substrate is fabricated in an flat, arrayed format using traditional injection molding processes. After the arrayed parts are molded, conductive traces are integrated with the substrate. In one embodiment, forming the conductive traces includes metalizing the parts with a conductive layer, such as copper, applied to one or more of the substrate surfaces. The desired conductive pattern is then laser cut into the metallization. A chemical process is used to etch away undesired metalized regions. Desired metalized areas are plated. Plating materials include, but are not limited to, nickel, gold or a combination thereof. The arrays are separated into individual parts. Electronics are assembled onto the individual parts and the parts are tested. Having the substrate in a flat configuration, as opposed to a 3D form, allows for more efficient assembly of the electronics to the substrate and also simplifies subsequent testing. In various embodiments, one or more electronic components may be added and tested before the arrayed parts are separated. It is understood that other materials and processes for forming and assembling the substrate are possible without departing from the scope of the present subject matter.

Figure 5:
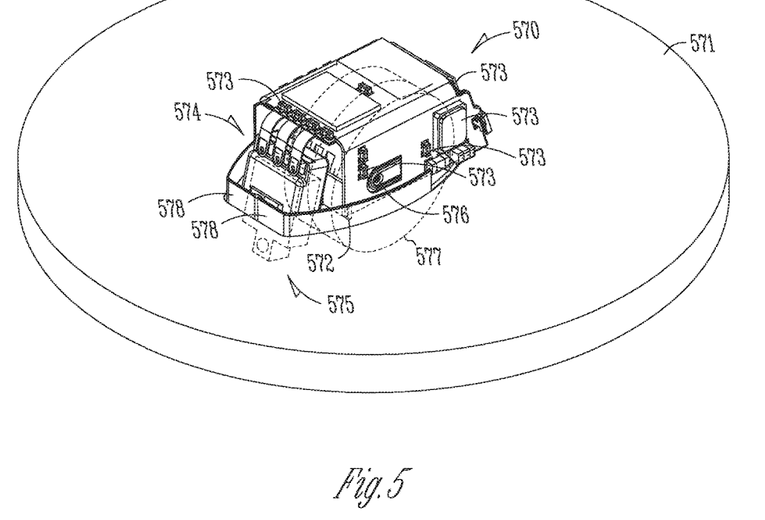
FIG. 5 shows an assembled 3D substrate installed in a hearing aid faceplate according to one embodiment of the present subject matter.

FIG. 5 shows an assembled 3D substrate 570 installed in a hearing aid faceplate 571 according to one embodiment of the present subject matter. The 3D substrate 570 is folded to define a battery cavity within an opening in the hearing aid faceplate 571. The shape of the folded substrate is retained using mated slots and tabs 572. The substrate includes hearing assistance electronics 573 distributed about at least the exterior of the defined battery cavity in areas normally not conducive to placement of electronics. The 3D substrate includes contact pads 574 for connecting to a microphone 575 inserted through the opening in the hearing aid faceplate 571. In various embodiments, the 3D substrate includes contact pads for electrically connecting other electronic components to the hearing assistance electronics including, but not limited to, a speaker, wiring harnesses, switches, visual indicators, volume controls, mode selectors or combinations thereof. The 3D substrate includes contact pads 576 for electrically connecting a battery 577 with the hearing aid electronics 573 using direct contact. In various embodiments, the 3D substrate 570 includes wireless electronics for wireless RF or inductive communications. The wireless electronics connect to an antenna 578 integrated with the 3D substrate. The antenna 578 is inserted in a groove on the faceplate mounting surface to provide mounting stability and rigidity to the 3D folded substrate. In some embodiments, the flex antenna loop floats so that it fills the inside shape of the shell and can maximize aperture using variations in the shape of each shell. In various embodiments, the antenna includes conductive traces integrated with the faceplate and connected to the wireless electronics of the 3D substrate.

Figure 6:
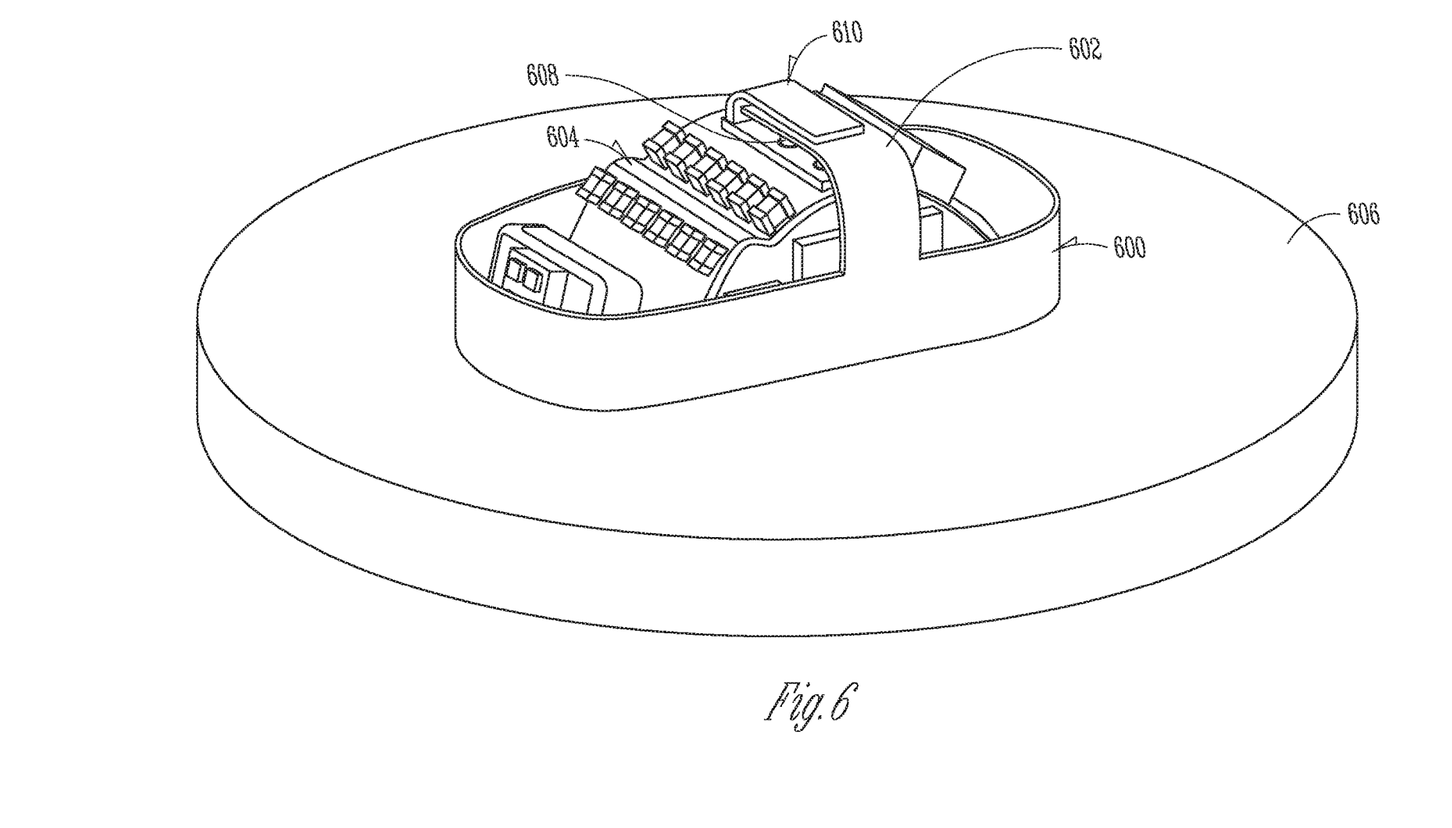
FIG. 6 illustrates a 3D substrate electronics assembly and flex antenna, according to one embodiment of the present subject matter.

FIG. 6 illustrates a 3D substrate electronics assembly 604 and flex antenna 600, according to one embodiment of the present subject matter. According to various embodiments, the flex antenna 600 includes a flex antenna feed 602 that is mechanically engaged and electrically connected to the assembly 604 using spring loaded contacts 608. The flex antenna feed is constrained by a metal backing feature 610 of the assembly, in various embodiments. In some embodiments, the assembly is mounted to, or part of, a faceplate 606 of a heating assistance device.

Figure 7:
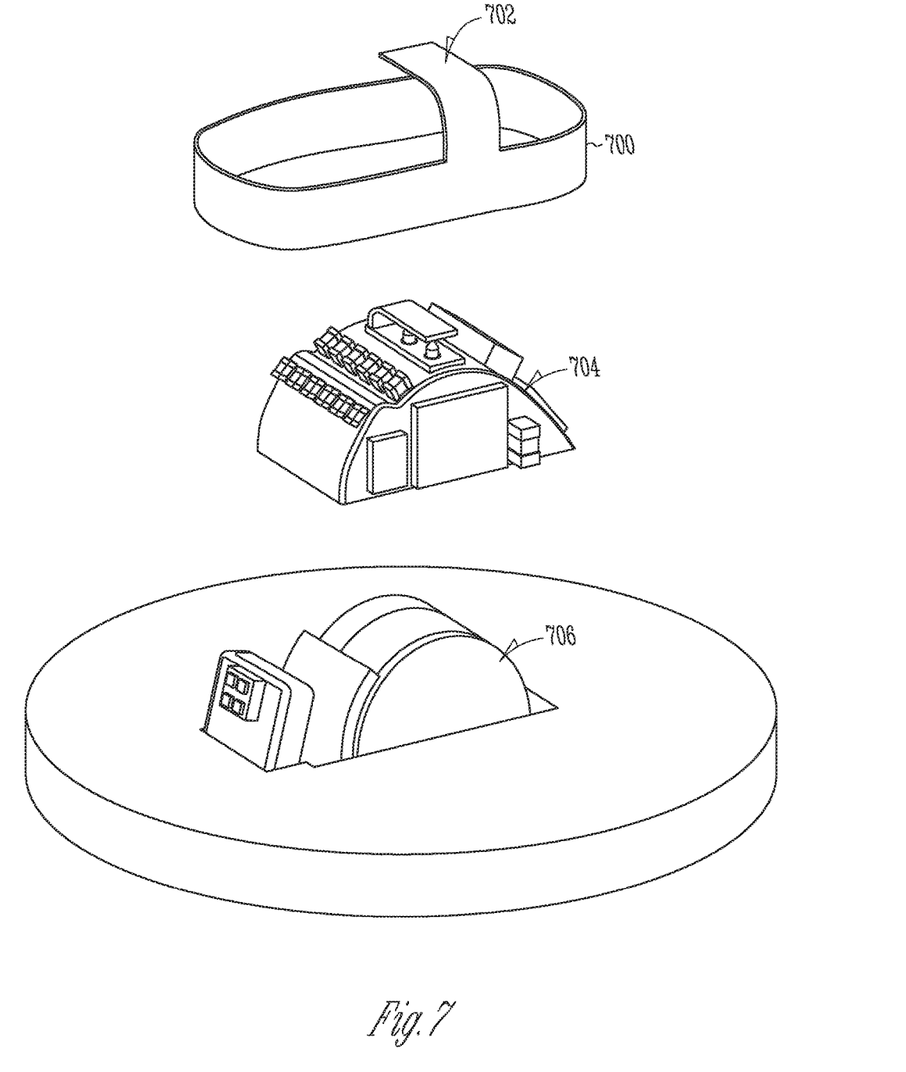
FIG. 7 illustrates an exploded view of the assembly of FIG. 6, according to one embodiment of the present subject matter.

FIG. 7 illustrates an exploded view of the assembly of FIG. 6, according to one embodiment of the present subject matter. A flex antenna 700 includes a flex antenna feed 702, which is configured to mechanically engage to 3D substrate electronics assembly 704. The 3D substrate electronics assembly is configured to connect to custom faceplate hearing assistance device sub-assembly 706, in various embodiments.

One aspect of the present subject matter includes a hearing assistance device for a user, device including a housing, a battery disposed at least partially in the housing, and a substrate disposed at least partially in the housing, the substrate adapted to conform around the battery. A flexible antenna is configured to conform around a portion of the substrate, and hearing assistance electronics are mounted to the substrate. Various embodiments include spring loaded electrical contacts on the substrate, the contacts configured to mechanically engage and electrically connect to the flexible antenna.

Various embodiments also include a metal backing feature configured to constrain the flexible antenna when the spring loaded contacts engage the flexible antenna. The spring loaded contacts include pogo pins, in an embodiment. In one embodiment, the spring loaded contacts are non-metallurgical. A moisture resistant seal in included for preventing moisture ingress into the housing, in various embodiments. One embodiment includes a battery compartment, and the substrate includes electrical contacts adapted to mechanically contact the battery in the battery compartment. The substrate structurally forms a battery compartment, in an embodiment. The housing can include a behind-the-ear housing, an in-the-ear housing, an in-the-canal housing, or a receiver-in-the-canal housing, in various embodiments. According to various embodiments, the substrate is adapted to be folded to conform to the battery compartment. The device further includes a microphone electrically connected to the substrate, in an embodiment. In one embodiment, the device also includes a speaker electrically connected to the substrate. Various embodiments includes methods for forming and assembling the device of the present subject matter.

One aspect of the present subject matter includes a hearing assistance device for a user, device including a three-dimensional folded substrate including contours configured to form internal housing surfaces of the hearing assistance device, hearing assistance electronics mounted to the substrate, a flexible antenna configured to conform around a portion of the substrate, and spring loaded electrical contacts on the substrate, the contacts configured to mechanically engage and electrically connect to the flexible antenna.

Various embodiments include a metal backing feature configured to constrain the flexible antenna when the spring loaded contacts engage the flexible antenna. The spring loaded contacts include pogo pins, in various embodiments. In various embodiments, the spring loaded contacts are non-metallurgical. The device includes a moisture resistant seal for preventing moisture ingress into the housing, in various embodiments. According to various embodiments, the moisture resistant seal includes one or more of a gasket, glue, rubber, a polymer, or a liquid crystal polymer (LCP). Various embodiments includes methods for forming and assembling the device of the present subject matter.

Various embodiments include antenna feeds engaging a 3D flex substrate via dynamic, non-metallurgical connection means. In various embodiments, the connection means include spring loaded contacts, such as pogo pins. Other connection means can be used without departing from the scope of the present subject matter.

Figure 8A:
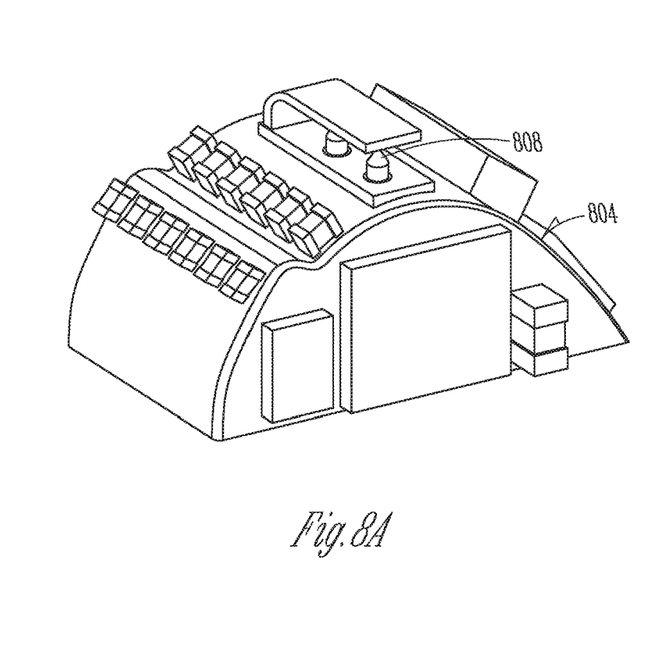
FIGS. 8A-8B illustrate a 3D substrate electronics assembly including a metal backing feature, according to one embodiment of the present subject matter.
Figure 8B:
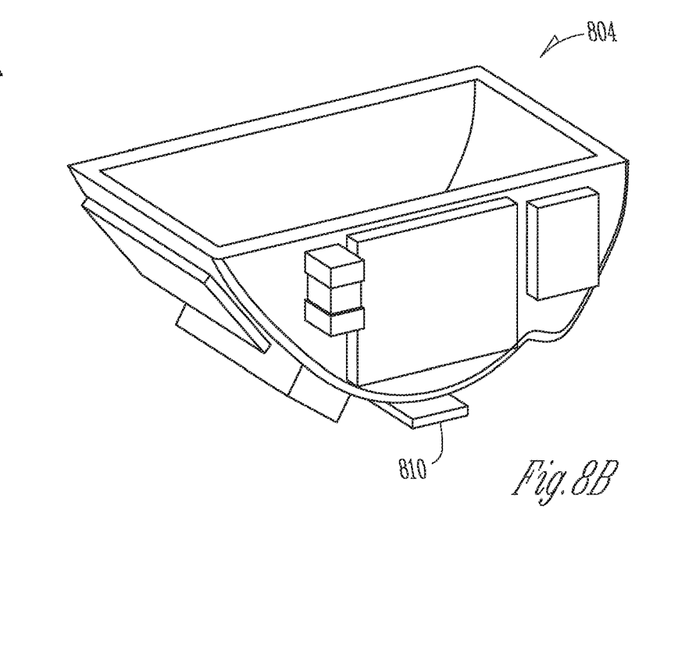

FIGS. 8A-8B illustrate a 3D substrate electronics assembly 804 including a metal backing feature 810, according to one embodiment of the present subject matter. FIG. 8A illustrates the 3D substrate electronics assembly 804 with hearing assistance electronics mounted thereon. The assembly 804 includes a metal backing feature 810, the feature 810 configured to constrain an antenna feed when spring loaded contacts 808 engage and connect to the antenna feed. FIG. 8B illustrates an inverse orientation of the assembly 804 of FIG. 8A.

Figure 9A:
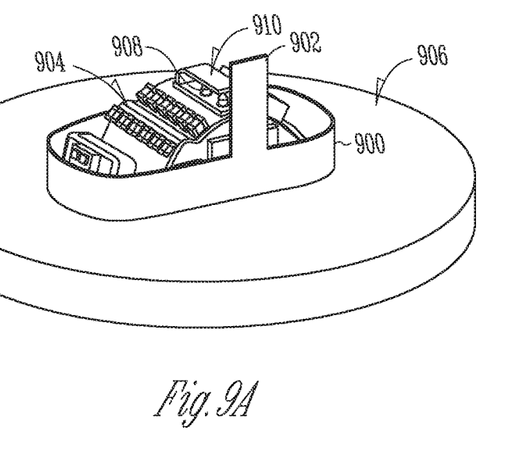
FIGS. 9A-9C illustrate a 3D substrate electronics assembly and a hearing assistance device faceplace, according to one embodiment of the present subject matter.
Figure 9B:
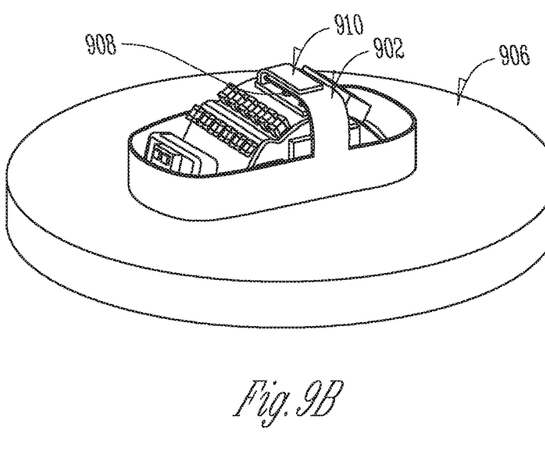
Figure 9C:
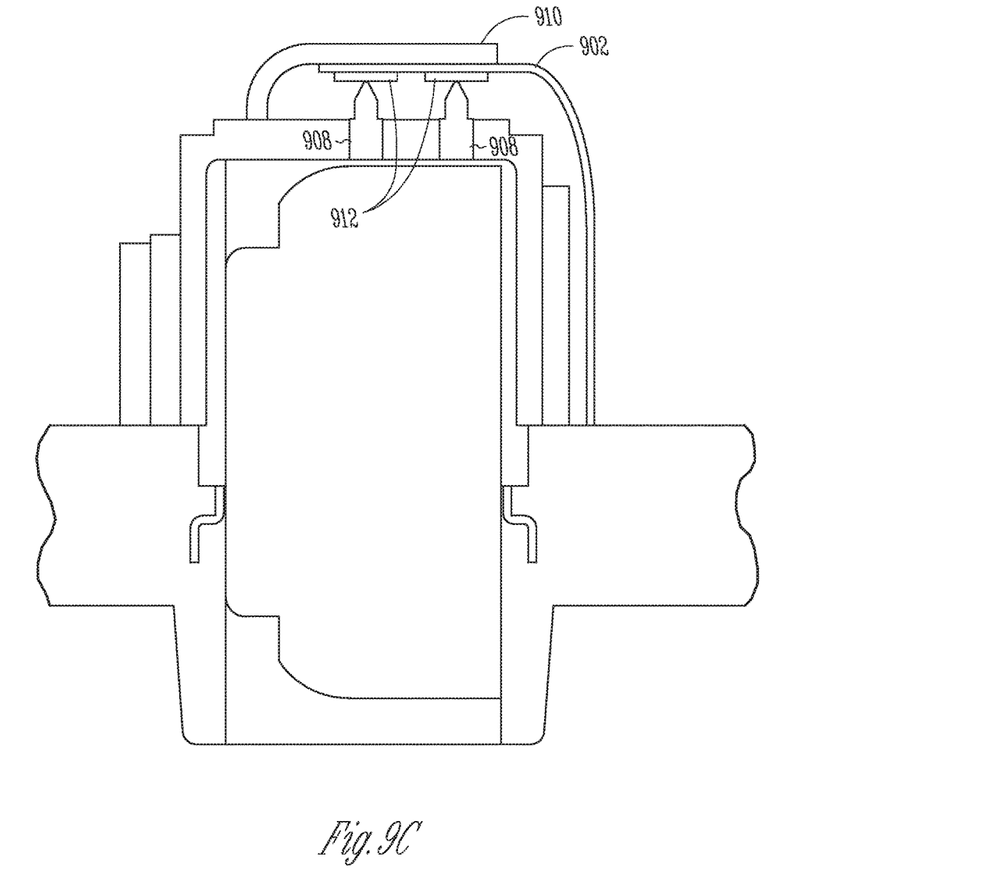

FIGS. 9A-9C illustrate a 3D substrate electronics assembly 904 and a hearing assistance device faceplace assembly 906, according to one embodiment of the present subject matter. FIG. 9A illustrates a flexible antenna 900 positioned around a portion of the substrate electronics assembly 904, the flexible antenna including a flex antenna feed 902. The flex antenna feed 902 is shown before connecting to the assembly. In various embodiments, the assembly 904 includes a backing feature 910 and spring loaded contacts 908. In FIG. 9B, the antenna feed 902 is inserted under the backing feature 910, and engages with spring-loaded contacts 908 in the 3D substrate assembly 904, to electrically connect the antenna to 900 to the assembly 904, in various embodiments.

FIG. 9C illustrates a cross-section of FIG. 9B, showing the 3D substrate assembly, antenna and hearing assistance device assembly. In various embodiments, antenna feed 902 includes antenna feed pads 912 that contact spring loaded contacts 908 when constrained by backing feature 910 of the assembly. The contacts can be spring loaded in various embodiments. The contacts and the backing feature can be made of metal, in various embodiments. Other types of contacts and backing features can be used without departing from the scope of the present subject matter.

The 3D substrate can be used with a variety of hearing assistance device housings including, but not limited to, behind-the-ear, in-the-ear, on-the-ear, in-the-canal and completely-in-the-canal housings, as well as housings used for receiver-in-the-canal and cochlear implant applications. Use of a 3D substrate provides opportunities to make more efficient use of space inside of a hearing assistance device. In some examples, use of a 3D substrate takes advantage of traditionally unusable space within a hearing assistance device housing for additional electronics that in turn can provide increased processing power, additional features, additional memory or combinations thereof.

This application is intended to cover adaptations and variations of the present subject matter. It is to be understood that the above description is intended to be illustrative, and not restrictive. The scope of the present subject matter should be determined with reference to the appended claim, along with the full scope of legal equivalents to which the claims are entitled.

What is claimed is:

1. A hearing assistance device for a user, device comprising
    a housing;
    a battery disposed at least partially in the housing;
    a substrate disposed at least partially in the housing, the substrate adapted to conform around the battery;
    a flexible antenna configured to conform around a portion of the substrate;
    hearing assistance electronics mounted to the substrate; and
    spring loaded electrical contacts on the substrate, the contacts configured to mechanically engage and electrically connect to the flexible antenna.

2. The device of claim 1, further comprising a metal backing feature configured to constrain the flexible antenna when the spring loaded contacts engage the flexible antenna.

3. The device of claim 1, wherein the spring loaded contacts include pogo pins.

4. The device of claim 1, wherein the spring loaded contacts are non-metallurgical.

5. The device of claim 1, further comprising a moisture resistant seal for preventing moisture ingress into the housing.

6. The device of claim 1, further comprising a battery compartment, and wherein the substrate includes electrical contacts adapted to mechanically contact the battery in the battery compartment.

7. The device of claim 1, wherein the substrate structurally forms a battery compartment.

8. The device of claim 1, wherein the housing is a behind-the-ear housing.

9. The device of claim 1 wherein the housing is an in-the-ear housing.

10. The device of claim 1, wherein the housing is an in-the-canal housing.

11. The device of claim 1, wherein the housing is a receiver-in-the-canal housing.

12. The device of claim 1, wherein the substrate is adapted to be folded to conform to the battery compartment.

13. The device of claim 1, further comprising a microphone electrically connected to the substrate.

14. The device of claim 1, further comprising a speaker electrically connected to the substrate.

15. A hearing assistance device, comprising:
a three-dimensional folded substrate including contours configured to form internal housing surfaces of the hearing assistance device;
hearing assistance electronics mounted to the substrate;
a flexible antenna configured to conform around a portion of the substrate; and
spring loaded electrical contacts on the substrate, the contacts configured to mechanically engage and electrically connect to the flexible antenna.

16. The device of claim 15, further comprising a metal backing feature configured to constrain the flexible antenna when the spring loaded contacts engage the flexible antenna.

17. The device of claim 15, wherein the spring loaded contacts include pogo pins.

18. The device of claim 15, wherein the spring loaded contacts are non-metallurgical.

19. The device of claim 15, further comprising a moisture resistant seal for preventing moisture ingress into the housing.

20. The device of claim 19, wherein the moisture resistant seal includes one or more of a gasket, glue, rubber, a polymer, or a liquid cry seal polymer (LCP).

* * * * *